United States Patent

Jani et al.

Patent Number: 5,640,408
Date of Patent: Jun. 17, 1997

[54] QUASI FOUR-LEVEL TM:LUAG LASER

[75] Inventors: Mahendra G. Jani, Poquoson; Norman P. Barnes, Yorktown, both of Va.; Ralph L. Hutcheson, Bozeman, Mont.; Waldo J. Rodriguez, Hampton, Va.

[73] Assignee: Science and Technology Corporation, Hampton, Va.

[21] Appl. No.: 593,438

[22] Filed: Jan. 29, 1996

[51] Int. Cl.$^6$ ................................................ H01S 3/16
[52] U.S. Cl. .................................... 372/41; 372/75
[58] Field of Search ................. 372/39, 41, 69, 372/70, 75

[56] References Cited

U.S. PATENT DOCUMENTS 5,088,103  2/1992  Esterowitz et al.

OTHER PUBLICATIONS

Rodriquez et al; "Quasi–Two–Level Laser Operation of Tm:LuAg", in Coinference on Laser and Electro–Optics, vol. 8; pp. 174–175; Washington D.C.. 1994.

A. A. Kaminskii et al., "Investigation of Stimulated Emission From $Lu_3Al_5O_{12}$ Crystal With $Ho^{3+}$, $Er^{3+}$, and $Tm^{3+}$ Ions", Phys. Status Soledi 18a,(1973), pp. K–31–K33.

W. J. Rodriquez et al., "Quasi–Two–Level Laser Operation of Tm:LuAG", in Conference on Laser and Electro–Optics, vol. 8, Optical Soc. of Am. Technical Digest Serie, Washhington, DC, (1994) pp. 174–175.

Primary Examiner—Leon Scott, Jr.
Attorney, Agent, or Firm—Peter J. Van Bergen

[57] ABSTRACT

A quasi four-level solid-state laser is provided. A laser crystal is disposed in a laser cavity. The laser crystal has a LuAG-based host material doped to a final concentration between about 2% and about 7% thulium (Tm) ions. For the more heavily doped final concentrations, the LuAG-based host material is a LuAG seed crystal doped with a small concentration of Tm ions. Laser diode arrays are disposed transversely to the laser crystal for energizing the Tm ions.

8 Claims, 1 Drawing Sheet

QUASI FOUR-LEVEL TM:LUAG LASER

STATEMENT OF GOVERNMENT INTEREST

This invention was made with Government support under contract NAS1-19603 awarded by NASA. The Government has certain rights in this invention.

CROSS-REFERENCE TO RELATED PATENT APPLICATIONS

This patent application is related to co-pending patent application entitled "FLASHLAMP-PUMPED Ho:Tm:Cr:LuAG LASER", Ser. No. 08/593,791, filed on Jan. 29, 1996.

FIELD OF THE INVENTION

The invention relates generally to lasers, and more particularly to quasi four-level lasers operating at room temperature in the 2 μm wavelength region.

BACKGROUND OF THE INVENTION

Quasi four-level solid-state lasers operating in the 2 μm wavelength region are used for sensing wind velocity, as optical pumps for mid-infrared parametric oscillators, for remote sensing of water vapor or carbon dioxide, for medical applications such as laser angioplasty, for material processing applications, and for communications.

In general, quasi four-level lasers operating in the 2 μm wavelength region utilize laser material made from a host material doped with laser active ions from the group of rare earth ions such as holmium (Ho) and thulium (Tm), transition metal ions such as chromium (Cr) or combinations thereof. The host materials for such lasers come from the group of crystals such as YAG, YLF, YSGG, GSGG, GSAG, YSAG, YAlO, GGG, YGG and LLGG. To date, the Tm:YAG and Tm:YLF lasers have provided the best performance for diode-pumped, quasi four-level lasers operating at room temperature. However, the thresholds of these lasers are relatively high which can lead to thermal stresses in the laser crystals or rods as higher input energies are required.

SUMMARY OF THE INVENTION

Accordingly, it is an object of the present invention to provide a quasi four-level laser that operates at room temperature and has a reduced threshold for laser action.

Other objects and advantages of the present invention will become more obvious hereinafter in the specification and drawings.

In accordance with the present invention, a quasi four-level solid-state laser is provided. A laser cavity is defined by reflective elements aligned on a common axis to form a reflective path therebetween. A laser crystal or rod is disposed in the laser cavity along the common axis. The laser crystal has a LuAG-based host material doped to a final concentration between about 2% and about 7% thulium (Tm) ions. A narrowband energizing source such as laser diode array(s) are disposed transversely to the laser crystal for energizing the Tm ions.

DETAILED DESCRIPTION OF THE INVENTION

Figure 1:
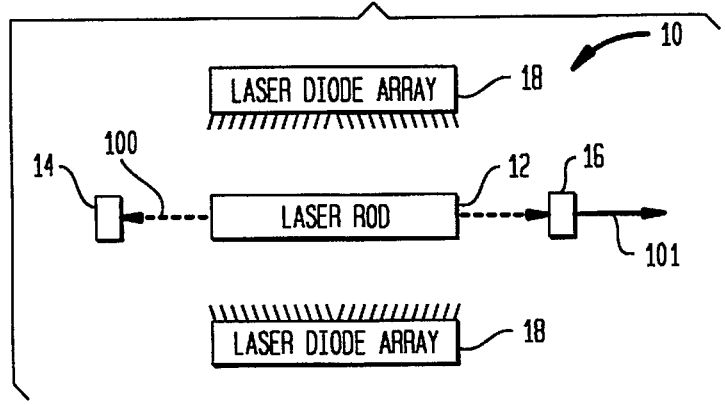
FIG. 1 is a schematic of the diode-pumped Tm:Cr:LuAG laser according to the present invention.

Referring now to the drawings, and more particularly to FIG. 1, a diode-pumped laser is shown schematically and referenced generally by numeral 10. Laser 10 includes a laser crystal or rod 12 disposed along the reflective path axis of a laser cavity defined by reflective elements or mirrors 14 and 16. The reflective path axis of laser 10 is referenced in FIG. 1 by dashed arrowed line 100. Accordingly, mirrors 14 and 16 form a resonator. To create laser emission, one of mirrors 14 and 16 is substantially or completely reflective while the other must be partially transmissive at the lasing wavelength of laser rod 12. For purpose of this description it will be assumed that mirror 14 is the completely reflective element and mirror 16 is partially transmission so that laser light at the selected wavelength is emitted. The emitted laser light of laser 10 is referenced in FIG. 1 by arrow 101. To excite laser rod 12 into laser emission, an excitation source is provided near laser rod 12. For purpose of the present invention, the excitation source is a narrowband excitation source such as one or more laser diode arrays 18 that are positioned transversely to laser rod 12.

Laser rod 12 is a crystal laser material having a host material based on lutetium aluminum garnet (LuAG) that is doped with thulium (Tm) ions. More specifically, the host material is either a pure LuAG seed crystal or a LuAG seed crystal doped with concentrations of between about 2% and 4% Tm ions. The percent concentration is defined herein as the percentage of Tm doping ions that are measured as being present in the doped material.

The rods used for laser rod 12 were fabricated from crystals grown with the Czochralski method. The raw materials used were four nines pure $Lu_2O_3$ with major impurity being Tm at 300 parts in $10^6$ (ppm), and five nines plus pure $Al_2O_3$. The materials were mixed with 0.005 excess $Lu_2O_3$ to a formulation of $Lu_{(3.015-x)}Tm_xAl_5O_{12}$. The mixing crucible had a 0.45 liter capacity and was made of pure iridium metal. Melting was accomplished in a radio-frequency heated zirconia furnace.

The seed crystal was fabricated from a (111) oriented LuAG rod. For the smaller final concentrations of Tm doping, Tm ions were mixed with a host material that consisted of a pure LuAg seed crystal. However, for the more heavily doped final concentrations of Tm, the host material was a doped LuAG seed crystal. More specifically, Sample I is based on a host material of a pure LuAG seed crystal that is doped to a final concentration of 2% Tm ions. Sample II is based on a host material of a 2% Tm-doped LuAG seed crystal that is then doped to a final concentration of 4% Tm ions. Sample III is based on a host material of a 4% Tm-doped LuAG seed crystal that is then doped to a final concentration of 7% Tm ions.

A Tm-doped LuAG seed crystal for the more heavily doped final concentrations of Tm is used because there is some lattice mismatch when the more heavily doped Tm:LuAG crystal is grown using pure LuAG as the seed crystal. By starting with a seed crystal that is doped to a lesser or equal concentration of Tm ions as compared to the final Tm ion concentration, a laser crystal of improved optical quality is achieved since stresses and strains present during crystal growth are reduced.

For all samples, a growth rate of 2.5 mm/hr was used. The growth was manually controlled to maintain a crystal diameter of approximately 25 mm. Crystals were 70 to 133 mm in length. Samples I, II and III were examined visually for scatter using both white light and a He-Ne laser. No scatter visible to the naked eye was observed. Concentrations were measured spectro-photometrically, and the distribution coefficients were determined to range from 0.86–0.90.

An absorption spectrum was taken on a Tm:LuAG sample in the spectral region around 0.8 μm. Using these results, the absorption efficiency was calculated as a function of the center wavelength of the diode array. Based on these results, for a diode array spectral bandwidth of 0.003 μm, the optimum wavelength for the laser diode arrays is 0.782 μm. Thus, Tm:LuAG is compatible with GaAlAs diode pumping.

The lifetime of the $^3F_4$ was measured to be 10.2 ms in all three Tm-LuAG samples. The lifetimes of all the Tm:LuAG samples available were measured by the use of the diode arrays to excite the Tm:LuAG samples. Initially, the fluorescence around 2.0 μm was nonexponential as the Tm $^3H_4$ manifold relaxed. To obtain the lifetime, the data from 5 to 10 ms beyond the end of the pump pulse were curve fitted to a simple exponential.

The effective stimulated-emission cross section at 2.023 μm is $0.30 \times 10^{-24} m^2$. The effective stimulated-emission cross section at 1.969 μm, which is near the local peak absorption of liquid water, is $0.18 \times 10^{-24} m^2$. Comparable values of the cross sections at these two wavelengths make this laser a potential candidate for processes associated with water absorption.

Three GaAlAs laser diode arrays, i.e., laser diode arrays 18, were arranged symmetrically about the periphery of the various Tm:LuAG samples used for laser rod 12. The three laser diode arrays were used to transversely pump the Tm:LuAG laser. The center wavelength of the laser diode arrays was 0.782 μm. The optical output of the diode arrays was measured in a separate experiment with a calibrated integrating sphere to collect all the diode array output energy. When pulse lengths of 1.0 ms were used, the maximum optical energy available from the laser diode arrays was 1.126J.

Laser 10 was operated at room temperature, e.g., between about 15° C. to 21° C., for each of Samples I, II and III. Such operation is characterized as maintaining laser rod 12 in a room temperature environment during operation of laser 10. Performance data was recorded using the above-described arrangement of laser diode arrays.

Each of Samples I, II and III was 4.0 mm in diameter and 10.0 mm in length to correspond with the length of the diode arrays. End surfaces of each sample rod were flat and normal to the axis of the sample rod and antireflection coated at 2.1 μm. Lateral surfaces of each sample rod were finished with a fine grind.

Figure 2:
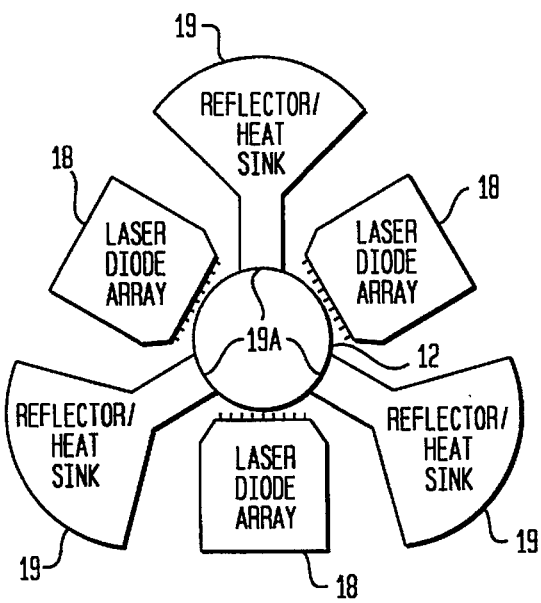
FIG. 2 is an end view of the laser rod showing the positions of the laser diode arrays according to one embodiment of the invention.

Use of three symmetrically placed laser diode arrays provided an efficient, transverse-pumping coupling geometry. As shown in FIG. 2, arranging diode arrays 18 120° apart provided a geometry in which each diode array faced a corresponding reflector/heat sink 19 in contact with and on the opposite side of laser rod 12. Each of reflectors/heat sinks 19 had a face 19A with a width of approximately 1.5 mm. Each face 19A was diametrically opposed to one of laser diode arrays 18. A gold coating on each reflector face 19A provided for a high reflectivity around 0.8 μm. Because the refractive index of LuAG is high (approximately 1.9), the divergence of the diode arrays is reduced considerably thereby permitting most of the pump radiation to be reflected back into laser rod 12 by each reflector face 19A. Thus, most of the pump radiation makes two passes through laser rod 12 which increases the absorption efficiency. Accordingly, an odd number of transversely position laser diode arrays placed symmetrically about laser rod 12 is preferred. Reflectors/heat sinks 19 can also aid in maintaining laser rod 12 in proper position and can act as heat sinks since they are generally made of metal that is in contact with laser rod 12. An additional advantage of using a transverse pumping source(s) is that laser power is easily increased without compromising efficiency since any length of laser rod can be accommodated simply by adding pump heads along the length of the rod.

Mirror 14 was a 0.8 m radius-of-curvature highly reflecting mirror while mirror 16 was a flat output coupler with a preferred reflectivity of 0.98. Separation between mirrors 14 and 16 was 0.5 m with laser rod 12 being approximately centered therebetween along reflective path axis 100. With this arrangement, the $TEM_{00}$ beam radius in the laser rod was approximately 0.6 mm which is considerably smaller than the laser rod radius. Pulse-repetition frequency for these experiments was 1.0 Hz to avoid thermal focusing.

Figure 3:
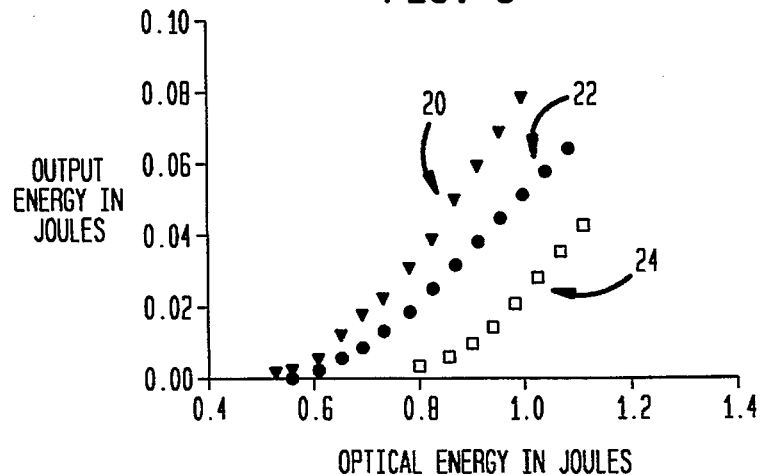
FIG. 3 is a graph of the laser output energy versus optical pump energy for Samples I, II and III.

With laser 10 configured as described, laser operation was achieved for each of Samples I, II and III. Laser operation with lower-reflectivity output mirrors requires significantly more pump energy because the stimulated-emission cross section of the Tm $^3F_4$ to $^3H_6$ transition is small Results for the laser rods with the three different concentrations of Tm are shown in FIG. 3 where curve 20 represents Sample II, curve 22 represents Sample I, and curve 24 represents Sample III. Laser performance criteria, e.g., threshold, slope efficiency and wavelength, are given below in Table 1 for each of Samples I, II and III.

| Sample | Mirror Reflectivity | Threshold (J) | Slope Efficiency | Wavelength (μm) |
| --- | --- | --- | --- | --- |
| I | 0.98 | 0.556 | 0.1186 | 2.0225 |
| II | 0.98 | 0.494 | 0.1693 | 2.0238 |
| III | 0.98 | 0.731 | 0.2036 | 2.0336 |

Laser operation with output mirrors of lower reflectivities was not possible because of the low gain of the Tm transition and the limited about of pump energy. Only Sample II produced useful output with any mirror except the highest available reflectivity of 0.98. For example, laser operation of Sample II was obtained with a 0.95 reflecting output mirror. However, threshold increased by a factor of approximately 1.5 to 0.777J.

The threshold does not increase as fast as the Tm concentration increases thereby indicating that the increased absorption efficiency (and possibly the increased quantum efficiency) tends to offset the increased population density in the lower laser level. Calculated absorption efficiencies as the final Tm concentration increases from 2% to 4% support this contention. As the final Tm concentration increases from 4% to 7%, the threshold increases more rapidly, although not as fast as the concentration. This supports the observation that the absorption efficiency is still increasing but not as fast as the Tm concentration.

Slope efficiency increases with increasing final Tm concentration almost exactly at the same rate as absorption efficiency increases with Tm concentration thereby indicating a nearly constant quantum efficiency. Although optical transparency is required for threshold to be achieved, slope efficiency depends only on incremental changes in the energy delivered to the upper laser manifold with increasing optical pump energy. As such, slope efficiency depends directly on the product of the absorption and quantum efficiencies, both of which can increase with increasing Tm concentration. The ratio of the absorption efficiencies for Sample I to Sample II to Sample III is 1.00:1.45:1.72, and the ratio of the differential absorption efficiencies is 1.00:1.43:1.71. Since the ratios are nearly the same, the quantum efficiencies can be considered to be the same.

The wavelength of the laser depends on the final concentration of Tm in the laser rod. The wavelength of the Tm:LuAG was measured with a 0.5-m Ebert monochromator with a 600 g/mm grating. The output of the monochromator was detected with an InSb detector and recorded as a function of wavelength. The peak emission wavelength was found to be approximately 2.023 µm for Samples I and II and approximately 2.034 µm for Sample III.

Operation of the laser rod with the higher Tm concentration at a longer wavelength is not unexpected. With a higher concentration, achieving optical transparency is more difficult because the population density of the lower laser level is directly proportional to the Tm concentration. Presumably, the longer wavelength is associated with a higher level in the lower laser manifold, which would have a lower thermal occupation factor and probably a lower effective stimulated emission cross section.

The advantages of the present invention are numerous. The quasi four-level Tm:LuAG laser operates at room temperature and achieves a low threshold of less than 0.5 J of total optical energy provided by laser diode arrays positioned transversely to the laser rod. Optical quality of the laser rod for the more heavily doped Tm concentrations is improved by starting with a seed crystal of LuAG doped with a small concentration of Tm ions that is less than the final concentration of Tm ions.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A quasi four-level solid-state laser crystal having improved optical quality, comprising a LuAG-based host material doped to a final concentration of Tm ions between about 4% and about 7% Tm ions, wherein said LuAG-based host material is a LuAG seed crystal doped with a concentration of between about 2% to 4% Tm ions where said concentration of between about 2% to 4% Tm ions is less than said final concentration of Tm ions, wherein said improved optical quality results as lattice mismatch present during growth of said laser crystal is reduced, and wherein when a narrowband energizing source is disposed transversely to said laser crystal for energizing said Tm ions, said laser crystal requires a lower threshold energy when compared to other quasi four-level lasers operating in the 2 µm wavelength region.

2. A quasi four-level solid-state laser crystal as in claim 1 wherein said narrowband energizing source is at least one laser diode array.

3. A quasi four-level solid-state laser crystal as in claim 2 wherein said at least one laser diode array is a GaAlAs laser diode array.

4. A quasi four-level solid-state laser crystal as in claim 1 wherein said LuAG-based host material is a LuAG seed crystal doped with a concentration of about 2% Tm ions, and wherein said final concentration of Tm ions is about 4% Tm ions.

5. A quasi four-level solid-state laser rod having improved optical quality for use in a laser cavity maintained at room temperature and defined by a first reflective element that is completely reflective and a second reflective element having a reflectivity of 0.98, said first reflective element and said second reflective element being aligned on a common axis to form a reflective path therebetween, said laser rod disposed in said laser cavity along said common axis, said laser rod comprising a LuAG-based host material doped to a final concentration of Tm ions between about 4% and about 7% Tm ions, wherein said LuAG-based host material is a LuAG seed crystal doped with a concentration of between about 2% to 4% Tm ions where said concentration of between about 2% to 4% Tm ions is less than said final concentration of Tm ions, wherein said improved optical quality results as lattice mismatch present during growth of said laser rod is reduced, and wherein when a plurality of laser diode arrays is disposed transversely to and symmetrically about said laser rod for energizing said Tm ions, said laser rod requires a lower threshold energy when compared to other quasi four-level lasers operating in the 2 µm wavelength region.

6. A quasi four-level solid-state laser crystal as in claim 5 wherein each of said plurality of laser diode arrays is a GaAlAs laser diode array.

7. A quasi four-level solid-state laser crystal as in claim 5 wherein said plurality of laser diode arrays comprises an odd number of laser diode arrays.

8. A quasi four-level solid-state laser crystal as in claim 5 wherein said LuAG-based host material is a LuAg seed crystal doped with a concentration of about 2% Tm ions, and wherein said final concentration of Tm ions is about 4% Tm ions.

* * * * *